US012768684B2

(12) United States Patent
Hoffman et al.

(10) Patent No.: US 12,768,684 B2
(45) Date of Patent: Oct. 20, 2026

(54) UNIVERSAL MULTI-MOUNT FOR HIGH VALUE ASSET MONITOR TAG

(71) Applicant: Raytheon Company, Tewksbury, MA (US)

(72) Inventors: Daniel R. Hoffman, Milford, NH (US); John A. Cogliandro, Hyde Park, MA (US)

(73) Assignee: Raytheon Company, Arlington, VA (US)

( * ) Notice: Subject to any disclaimer, the term of this patent is extended or adjusted under 35 U.S.C. 154(b) by 226 days.

(21) Appl. No.: 18/420,347

(22) Filed: Jan. 23, 2024

(65) Prior Publication Data

US 2025/0237534 A1 Jul. 24, 2025

(51) Int. Cl.

| | |
|---|---|
| ***G01D 11/24*** | (2006.01) |
| ***G01D 11/18*** | (2006.01) |
| ***H05K 5/02*** | (2006.01) |
| ***H05K 5/04*** | (2006.01) |
| *G01D 21/02* | (2006.01) |
| *H05K 5/03* | (2006.01) |

(52) U.S. Cl.

CPC ........... *G01D 11/245* (2013.01); *G01D 11/18* (2013.01); *H05K 5/0226* (2013.01); *H05K 5/04* (2013.01); *G01D 21/02* (2013.01); *H05K 5/03* (2013.01)

(58) Field of Classification Search

USPC ........................................................ 73/866.5

See application file for complete search history.

(56) References Cited

U.S. PATENT DOCUMENTS

| | | | |
|---|---|---|---|
| 7,479,877 | B2 | 1/2009 | Mortenson et al. |
| 8,009,060 | B2 | 8/2011 | Kramer et al. |
| 8,058,991 | B2 | 11/2011 | Zajac et al. |
| 8,643,503 | B2 | 2/2014 | Mostov |

(Continued)

FOREIGN PATENT DOCUMENTS

| | | |
|---|---|---|
| DE | 4305439 | 8/1994 |
| EP | 1882910 | 1/2008 |

(Continued)

OTHER PUBLICATIONS

"International Application Serial No. PCT US2025 012573, International Search Report mailed Apr. 10, 2025", 5 pgs.

(Continued)

*Primary Examiner* — Walter L Lindsay, Jr.
*Assistant Examiner* — Warren K Fenwick
(74) *Attorney, Agent, or Firm* — Schwegman Lundberg & Woessner, P.A.

(57) ABSTRACT

A mount for housing a sensor includes a housing, a lid, and a biasing means. The housing has a base plate and a plurality of side walls extending from the base plate to form a cavity to hold the sensor. The base plate couples the mount with a surface. The lid couples with a first side wall of the plurality of side walls and includes a through hole. A gap is formed between a portion of the lid and a second side wall of the plurality of side walls when the lid is coupled with the second side wall. The gap and the through hole are configured to permit transmission of data from the sensor and the mount. The biasing means extends from a bottom surface of the lid toward the base plate. The biasing means biases the sensor against the base plate in a longitudinal and lateral directions.

20 Claims, 14 Drawing Sheets

(56) References Cited

U.S. PATENT DOCUMENTS

| | | | | |
|---|---|---|---|---|
| 8,661,923 | B1 | 3/2014 | Willett et al. | |
| 8,797,161 | B2 | 8/2014 | Aflalo | |
| 9,335,796 | B2 | 5/2016 | Ribich | |
| 9,776,730 | B1 | 10/2017 | Leon et al. | |
| 10,041,819 | B2 * | 8/2018 | Tanizaki | B65D 83/0817 |
| 10,102,492 | B1 | 10/2018 | Trishaun | |
| 10,248,914 | B2 | 4/2019 | Stoughton et al. | |
| 10,522,020 | B2 | 12/2019 | Cooper | |
| 11,147,175 | B2 * | 10/2021 | Castillo de la Cruz | G11B 33/124 |
| 11,623,747 | B1 | 4/2023 | Back et al. | |
| 11,807,385 | B2 | 11/2023 | Armes | |
| 2003/0071165 | A1 | 4/2003 | Fiebick et al. | |
| 2005/0248463 | A1 | 11/2005 | Williams et al. | |
| 2005/0248464 | A1 | 11/2005 | Rakes et al. | |
| 2006/0113302 | A1 | 6/2006 | Mandava et al. | |
| 2007/0138274 | A1 | 6/2007 | Saperstein et al. | |
| 2008/0304443 | A1 | 12/2008 | Twitchell, Jr. | |
| 2009/0134999 | A1 | 5/2009 | Dobson et al. | |
| 2009/0164055 | A1 | 6/2009 | Kosmas | |
| 2009/0174989 | A1 | 7/2009 | Nagel et al. | |
| 2009/0183584 | A1 | 7/2009 | Valoff et al. | |
| 2009/0307000 | A1 | 12/2009 | Scheid et al. | |
| 2010/0206992 | A1 | 8/2010 | Woodland et al. | |
| 2011/0018703 | A1 | 1/2011 | Tracy et al. | |
| 2011/0018707 | A1 | 1/2011 | Dobson et al. | |
| 2011/0286197 | A1 | 11/2011 | Jaeger et al. | |
| 2012/0069434 | A1 | 3/2012 | Shen | |
| 2012/0132552 | A1 | 5/2012 | Salour et al. | |
| 2012/0180565 | A1 | 7/2012 | Bailey et al. | |
| 2012/0181270 | A1 | 7/2012 | Smith | |
| 2014/0111334 | A1 | 4/2014 | Carpenter et al. | |
| 2016/0138947 | A1 | 5/2016 | Tanizaki | |
| 2016/0299412 | A1 | 10/2016 | Webster | |
| 2017/0118873 | A1 | 4/2017 | Szarek | |
| 2019/0226886 | A1 | 7/2019 | Bromley | |
| 2019/0372324 | A1 | 12/2019 | Gaudreau | |
| 2020/0025785 | A1 | 1/2020 | Zusman | |
| 2020/0132644 | A1 | 4/2020 | Micalizzi et al. | |
| 2020/0355536 | A1 | 11/2020 | Welle et al. | |
| 2021/0390499 | A1 | 12/2021 | Corrodi et al. | |
| 2022/0074690 | A1 | 3/2022 | Lloyd | |
| 2022/0260395 | A1 | 8/2022 | Boschert et al. | |
| 2023/0027776 | A1 | 1/2023 | Sherman | |
| 2023/0082027 | A1 | 3/2023 | Hogeman et al. | |
| 2023/0127433 | A1 * | 4/2023 | Kraemer | G01L 19/14 342/124 |
| 2023/0296420 | A1 | 9/2023 | Siegfried et al. | |
| 2023/0350773 | A1 | 11/2023 | Cogliandro et al. | |
| 2023/0376500 | A1 | 11/2023 | Goff et al. | |
| 2025/0228059 | A1 * | 7/2025 | Shen | H10K 30/40 |

FOREIGN PATENT DOCUMENTS

| | | |
|---|---|---|
| IN | 202217064365 | 9/2023 |
| WO | 2023193005 | 10/2023 |

OTHER PUBLICATIONS

"International Application Serial No. PCT US2025 012573, Written Opinion mailed Apr. 10, 2025", 6 pgs.

* cited by examiner

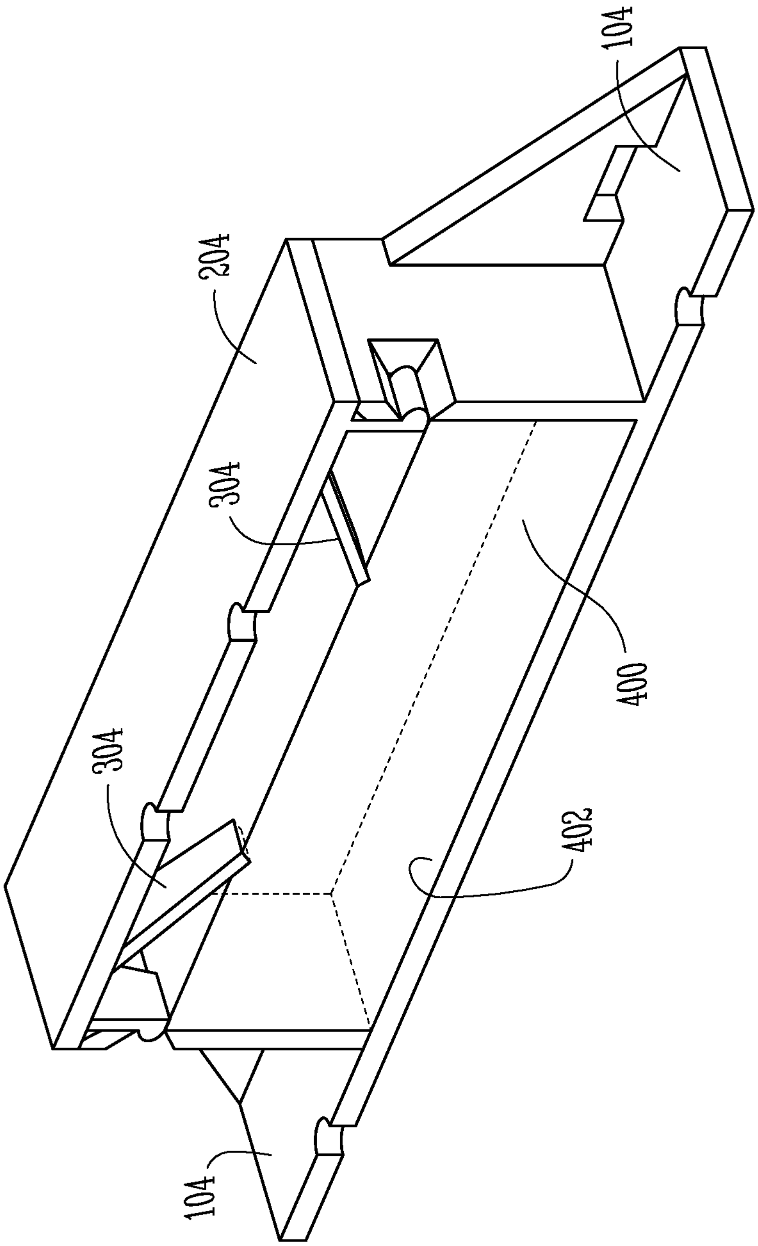
*Fig. 4*
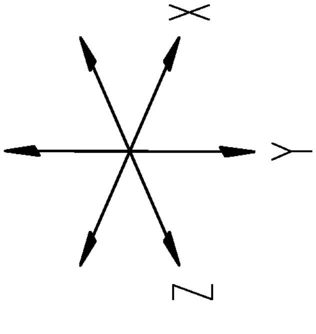

UNIVERSAL MULTI-MOUNT FOR HIGH VALUE ASSET MONITOR TAG

TECHNICAL FIELD

Examples relate to a mount for an attachment to a valuable asset and more specifically to a mount configured to hold a sensor that monitors conditions associated with the sensor.

BACKGROUND

Sensors can be affixed to an asset to monitor the asset along with an environment associated with the asset. Typically, these sensors are directly attached to the asset in a permanent or semi-permanent manner to an outside surface of the asset. Since the sensors are directly attached to the asset in a permanent or semi-permanent manner, if replacement or reuse of the sensor is desired, removal of the sensor from the asset can be extremely difficult. By virtue of the sensor being attached to an outside surface of an asset, the sensor is exposed to the elements. This exposure can cause damage to the sensor. Moreover, since the sensor is at an exposed surface, the sensor can be physically damaged during handling of the asset. The user may also desire to replace sensors due to design changes, battery life issues or simply to stop monitoring a particular asset and then reuse the sensor elsewhere.

BRIEF DESCRIPTION OF DRAWINGS

FIG. 4 illustrates the lid of FIGS. 2 and 3 biasing a sensor disposed within a cavity of a housing defined by the mount.

DETAILED DESCRIPTION

The following description and the drawings sufficiently illustrate teachings to enable those skilled in the art to practice them. Other embodiments may incorporate structural, logical, electrical, process, and other changes. Portions and features of some examples may be included in, or substituted for, those of other examples. Teachings set forth in the claims encompass all available equivalents of those claims.

Examples relate to a mount that can be used to attach a sensor to an asset. The mount can include a housing defined by a base plate and side walls extending from the base plate to create a cavity that can hold the sensor. A lid can cover the cavity in a closed position such that the sensor mounted within the cavity is enclosed by the mount. The lid can include a biasing means, which can bias the sensor against the base plate such that the sensor is held firmly in place against the base plate. The mount can be configured to allow for the transmission of data from the sensor in the form of wires, magnetic waves or RF signals when the sensor is inside the mount. The wires can transmit data to a remote location when the sensor is tracking conditions associated with the casing or an asset disposed within the casing. In particular, the lid, which can include through holes, can rest on a top surface of the side walls. In examples where the sensor transmits signals via a wired connection, the wires can traverse from the inside of the mount to the outside via the through holes when the sensor is disposed within the housing. A gap can exist between the lid and the top surface of the side walls when the lid is in a closed position. The gap can allow for the transmission of data.

The lid can couple with the housing in a variety of ways. The lid can couple with the at least one side wall using a hinge where the lid can move between an open position and a closed position relative to the cavity via the hinge. As will be described further on, the lid, the hinge, and the at least one side wall can form a unitary structure. The lid can couple with the housing via tabs extending therefrom that can engage recesses formed in the side walls. Gaps can be formed between the tabs and the side wall recesses, which can allow for the transmission of data from the sensor within the cavity. The lid can also rest over the top surface of the side walls or between the side walls.

The biasing means can include a compression spring that can extend between a surface of the lid and the sensor when the sensor is disposed within the cavity and apply a compressive force against the sensor. The biasing means can be unitary with the lid. The biasing means can also include support members that can extend between a surface of the lid and the sensor when the sensor is disposed within the cavity and apply a compressive force against the sensor. Moreover, the lid can include a lip that can function to bias the sensor against the base plate when the lid is coupled with the housing.

Figure 1:
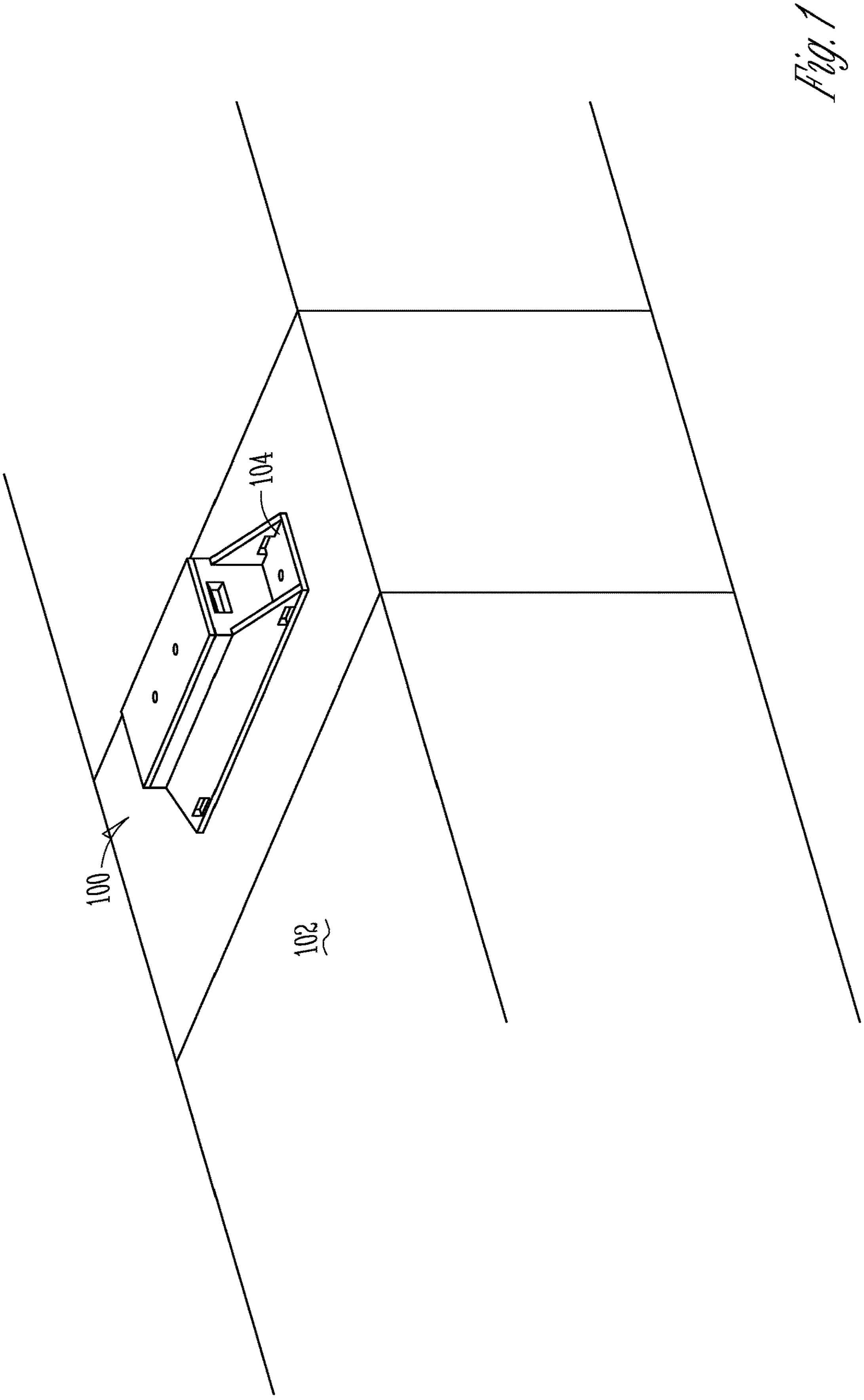
FIG. 1 illustrates, by way of example, a mount attached to a casing.

Now making reference to FIG. 1, a mount 100 is shown attached to a surface of a casing 102 via a base plate 104. The casing 102 can hold any type of asset, such as armament, chemicals, medical supplies, medical equipment, food supplies, or the like, that requires monitoring with the use of a sensor. The sensor can be used to track various conditions, such as humidity, light exposure, temperature, shock, vibration, pressure, and the like. Moreover, in the discussion that follows, reference is made to attaching the mount 100 to the casing 102. However, the mount 100 can be attached to anything, including but not limited to, trailers, a vehicle chassis, a boat, or any other type of structure subjected to dynamic forces and external environments.

Figure 2:
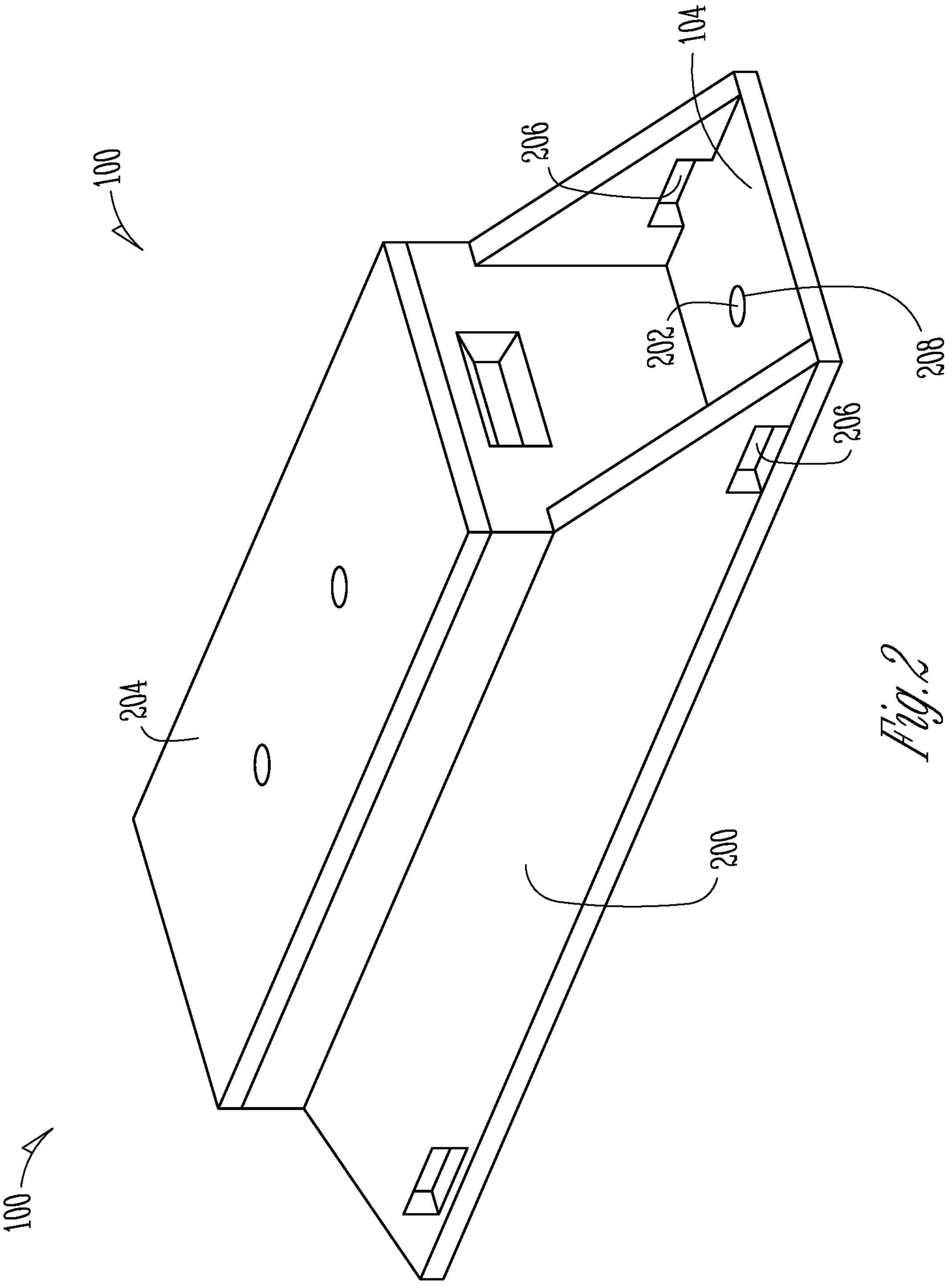
FIGS. 2 and 3 show the coupling of a lid of the mount in FIG. 1 to a housing of the mount.
Figure 3:
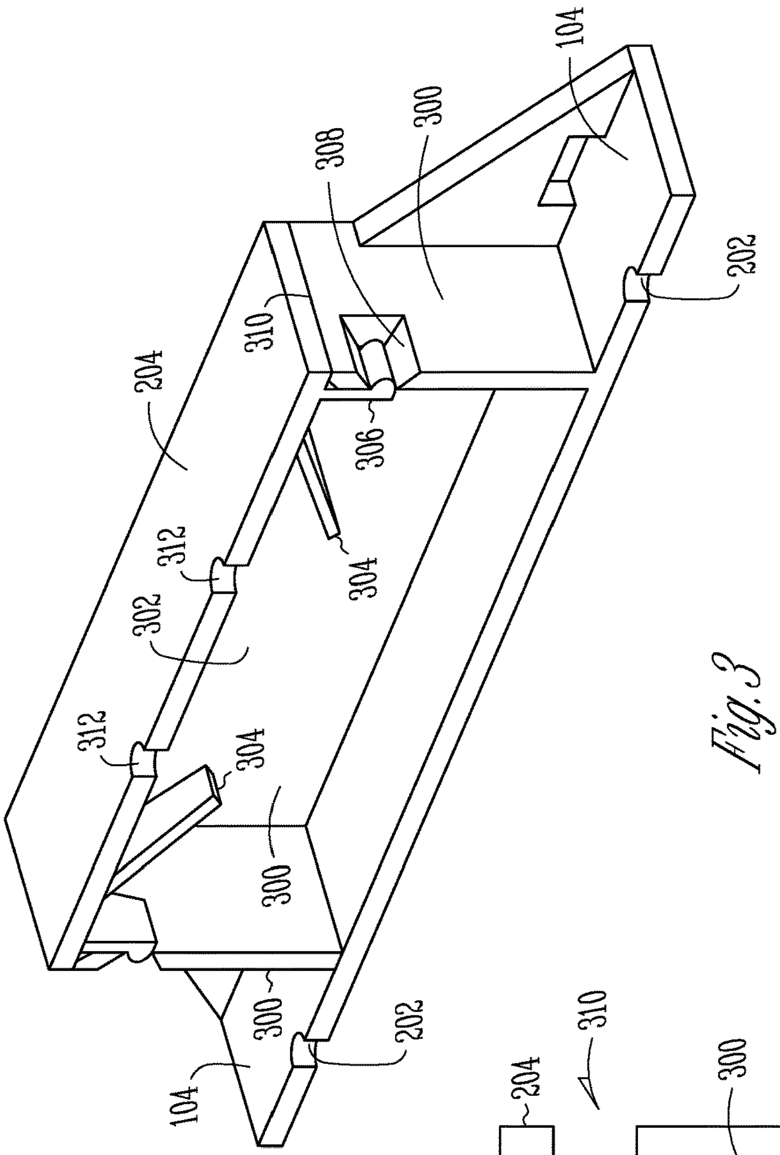

The mount 100 can include a housing 200 (FIG. 2) having the base plate 104 and side walls 300 (FIG. 3) extending from the base plate 104. Together, the base plate 104 and the side walls 300 can form a cavity 302 within which a sensor 400 (FIG. 4) can be disposed. As can be seen in FIG. 3, the base plate 104 can extend past the side walls 300 on either side of the housing 200. The base plate 104 can include fastener holes 202 at a portion of the base plate 104 that extends beyond a side wall of the housing 200. The fastener holes 202 can be configured to receive fastening means. The fastening means can pass through the fastener holes 202 and into the casing 102 in order to secure the mount 100 to a surface of the casing 102. The fastening means can be rivets, threaded fasteners, or the like. In addition to fastening means, the mount 100 can be attached to the casing 102 using two-sided tape or an epoxy resin. It may fit into a purpose built opening in the asset for additional mounting integrity.

The mount 100 can be formed of a polymer such as polyethylene terephthalate (PET), nylon, or any other type of material. Moreover, as will be discussed further below, the mount 100 can be formed of iron, steel, aluminum or other metal in cases where temperature transfer or other variables are optimized by the mount's material. In instances where the mount 100 is formed of a polymer or nylon, the mount 100 can be formed with an injection molding process or any other suitable process.

The mount 100 can also include a lid 204 that can couple with one of the side walls 300 in order to enclose the sensor 400 within the cavity 302 and the housing 200. Sensor support mechanisms 304 can extend from a bottom surface of the lid 204 towards a bottom surface 402 of the base plate 104. The sensor support mechanism 304 can be a biasing means that functions to bias the sensor 400 against the bottom surface 402 along a longitudinal direction Y. The sensor support mechanism 304 can be an arm formed of a material that can apply a force against the sensor 400 when the lid 204 is secured against the housing 200. Examples of materials can include a polymer such as PET, nylon, metal spring or any other type of material that can bias the sensor 400 towards the bottom surface 402 when the lid 204 is secured to the housing 200.

When the sensor support mechanism 304 biases the sensor 400 against the bottom surface 402 along the longitudinal direction Y, the sensor support mechanism 304 can bias the sensor 400 in a lateral direction X and a lateral direction Z, thereby rigidly holding the sensor 400 in place against the bottom surface 402. Therefore, if the mount 100 is subjected to extreme dynamic forces, such as the casing 102 falling or being subjected to other types of impact loads when the mount 100 is attached to the casing 102, the sensor support mechanism 304 holds the sensor 400 against the bottom surface 402. Furthermore, by rigidly biasing the sensor 400 against the bottom surface, any type of vibration, shock, or any other dynamic force is transmitted to the sensor 400 via the bottom surface 402, thereby minimizing data loss between the casing 102 or an asset and the sensor 400. Specifically, biasing the sensor 400 against the bottom surface can facilitate direct readings of vibration and/or shock imparted to the casing 102 and assets.

The sensor support mechanism 304 can also offset different manufacturing tolerances between different portions of the mount. Thus, if the housing 200 has a five percent tolerance and the lid 204 has a five percent tolerance, which could stack up to a ten percent tolerance, by virtue of being bias able, the sensor support mechanism 304 can offset tolerance stack-ups.

Figure 5:
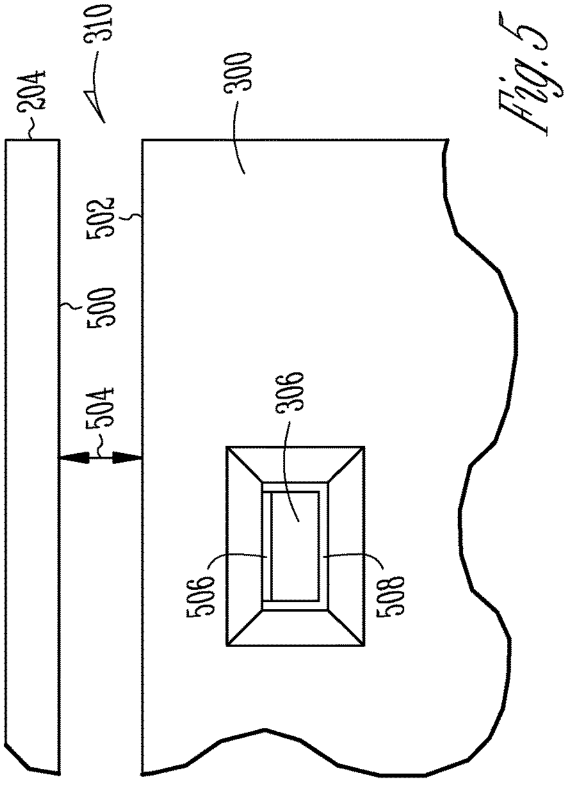
FIG. 5 illustrates a gap defined between a side wall of the housing of FIGS. 2 and 3 and the lid shown in FIGS. 2 and 3.

The lid 204 can include a tab 306 that can engage with a recess 308 of the side wall 300. The tab 306 can engage with the side wall recess 308 as shown in FIG. 3 and secure the lid 204 with the housing 200. When the lid 204 is secured with the housing 200 in a closed position, the lid 204 can rest on the side walls 300 and form a seam 310. In particular, the seam 310 can be formed between a bottom surface 500 of the lid 204 and a top surface 502 of the side wall 300. In addition, a gap 504 can be formed between the side wall top surface 502 and the lid bottom surface 500 at the seam 310. Gaps 506 and 508 can also be formed between the tab 306 and the side wall recess 308 as shown in FIG. 5. For purposes of description, the gaps 504-508 are exaggerated. The lid 204 can also include passageways 312 that can function to vent the cavity 302 when the lid 204 is secured to the housing 200 in order to maintain atmospheric equilibrium.

By virtue of having the seam 310 and the gap 504 formed at the seam 310 along with the gaps 506 and 508 and the passageways 312, the mount 100 can be configured to permit transmission of data from the sensor 400 and through the mount 100. The sensor 400 can send signals to a location remote to the sensor 400 that is manned to monitor conditions of the casing 102 and, in particular, assets enclosed within the casing 102. Furthermore, in instances where the sensor 400 is attached directly to an asset, personnel at the remote location can directly monitor conditions associated with asset. The sensor 400 can establish a communications link, either directly or indirectly, with the remote location. The sensor 400 can operate in a frequency range of 30 MHz to 30 GHz with wavelengths in a range between 10 mm and 1 cm when a RF communication link is established between the sensor 400 and the remote location. Furthermore, in RF communications, L-band communications can be provided from 1,618.725 MHz to 1,626.5 MHz.

Furthermore, if the sensor 400 is local to a recipient of the data collected by the sensor 400, the sensor 400 can transmit the data via a wired or any suitable local wireless techniques, such as Bluetooth™, Zigbee™, a wireless data network (e.g., WiFi network or WiMax network), or the like.

Alternatively, the sensor 400 can operate in a frequency range of 30 KHz-900 KHz with wavelengths between 10 km to 1 km when a magnetic communication link is established between the sensor 400 and the remote location. In the magnetic band, the signals can easily penetrate through buildings, walls, and metal commonly found in harsh environments.

The magnetic waves or the RF signals can exit the mount 100 through the gaps 504-508 and the passageways 312. Moreover, the gaps 504-508 and the passageways 312 allow transmissions from the sensor 400 to be agnostic of a material of the mount 100. Thus, the mount 100 along with the base plate 104, the side walls 300, and the lid 204 can be formed from any material, such as a metal, including iron, that typically would interfere with magnetic wave or RF signal transmissions. In wired configurations the mount can provide holes for wires to be routed from the sensor to a larger system.

In addition to the fastener holes 202, the mount 100 can include strap passageways 206, which can be used to attach the mount 100 to the casing 102. A strap can be fed through the strap passageways 206 and around the casing 102. As such, the mount 100 can be secured to the casing 102.

Figure 6:
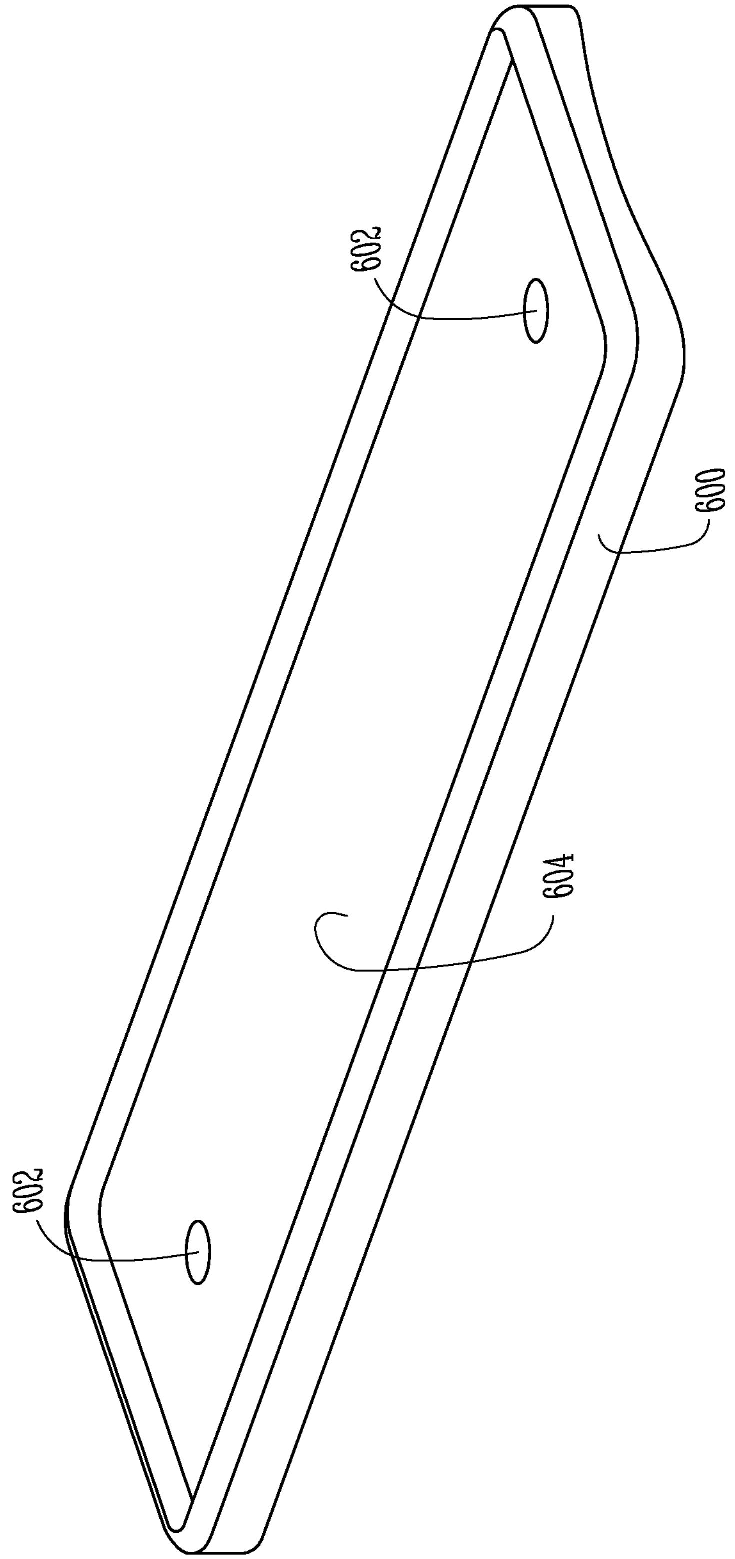
FIG. 6 shows a housing nesting tray that can be used to couple to mount in FIG. 1 to a curved surface.
Figure 7:
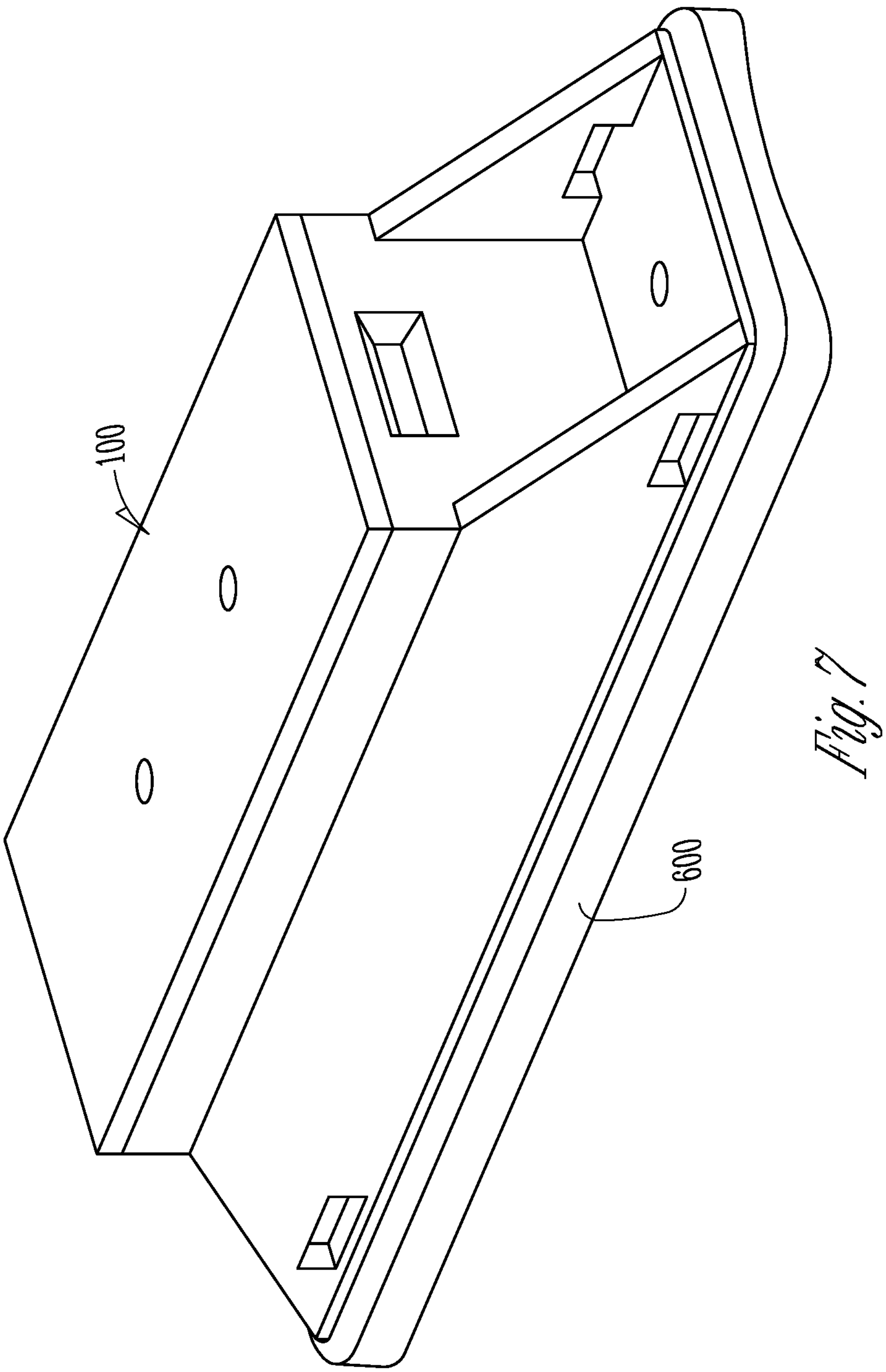
FIG. 7 illustrates the housing nesting tray of FIG. 6 coupled with the mount of FIGS. 2 and 3, FIGS. 8A and 8B illustrate disparate curvatures between the housing nesting tray of FIG. 6 and a curved surface to which the housing nesting tray can couple.
Figure 8A:
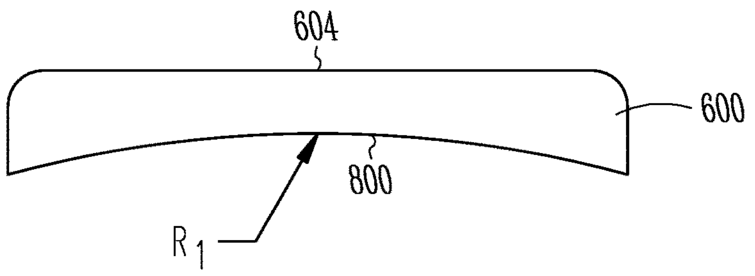
Figure 8B:
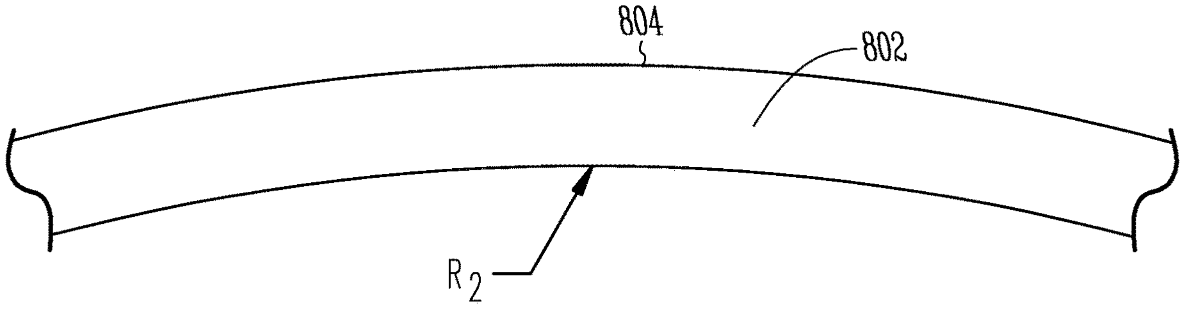

The mount 100 can also be configured to attach to a surface having a curved surface. A housing nesting tray 600 can be attached to a bottom surface of the base plate 104 as shown in FIGS. 6 and 7. The housing nesting tray 600 can include fastener holes 602, which can align with the fastener holes 202 of the base plate 104 to facilitate coupling with the base plate 104 at a surface 604 of the housing nesting tray 600. The housing nesting tray 600 can have a curved bottom surface 800 that opposes the nesting tray surface 604, as shown with reference to FIG. 8A. The curved bottom surface 800 can have a radius R1 configured to engage with a surface of a casing. The radius R1 can be determined based on the types of casings and assets to which the mount 100 will attach. In particular, different casings and different assets can have different radii. The mount can be customized for an exact match of radii. To reduce inventory and make the mount more widely acceptable, an average value of the radii can be determined of a larger set of assets and the average value can be used as the radius R1. Thus, in instance where the casing is curved, as shown in FIG. 8B, the radius R1 can differ from a radius R2 of a casing/asset 802 and a casing/asset surface 804.

Figure 9:
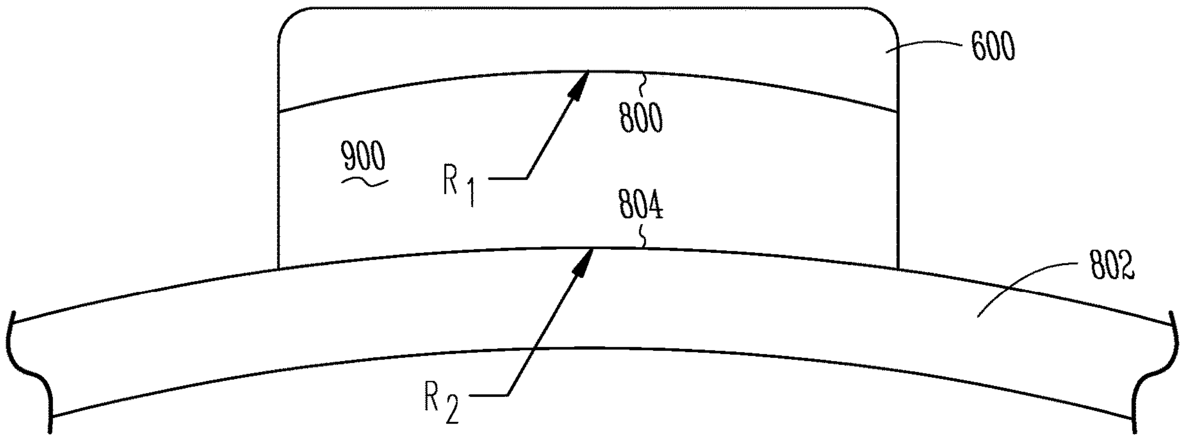
FIG. 9 shows a coupling means coupling the housing nesting tray of FIG. 6 with a curved surface having a radius different from a radius of the housing nesting tray.

In order to account for the difference between the radius R1 and the radius R2, making reference to FIG. 9, a coupling means 900, such as epoxy or two-sided tape, can be used to couple the curved bottom surface 800 to the casing surface 804. Here, a top portion of the coupling means 900 can have the radius R1 while a bottom portion of the coupling means 900 can have the radius R2. In examples, the epoxy can be a steel reinforced epoxy. Moreover, when the coupling means 900 is two-sided tape, the coupling means 900 can be a polyethylene sponge having a variety of thicknesses, such as 1/16, 1/32, or 3/32 inches, that can compress where the top portion has the radius R1 while the bottom portion has the radius R2.

Figure 11:
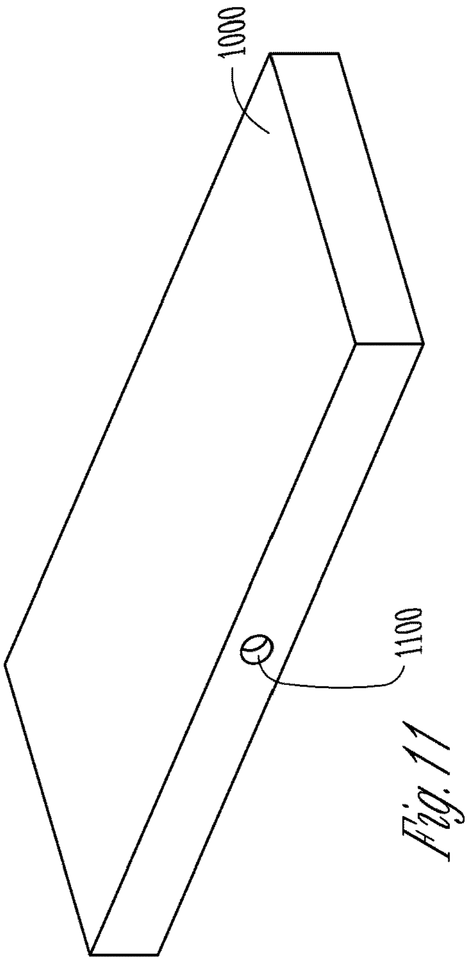
FIGS. 10 and 11 show the coupling of a lid to a housing that can be coupled with the casing of FIG. 1 in alternative examples.
Figure 10:
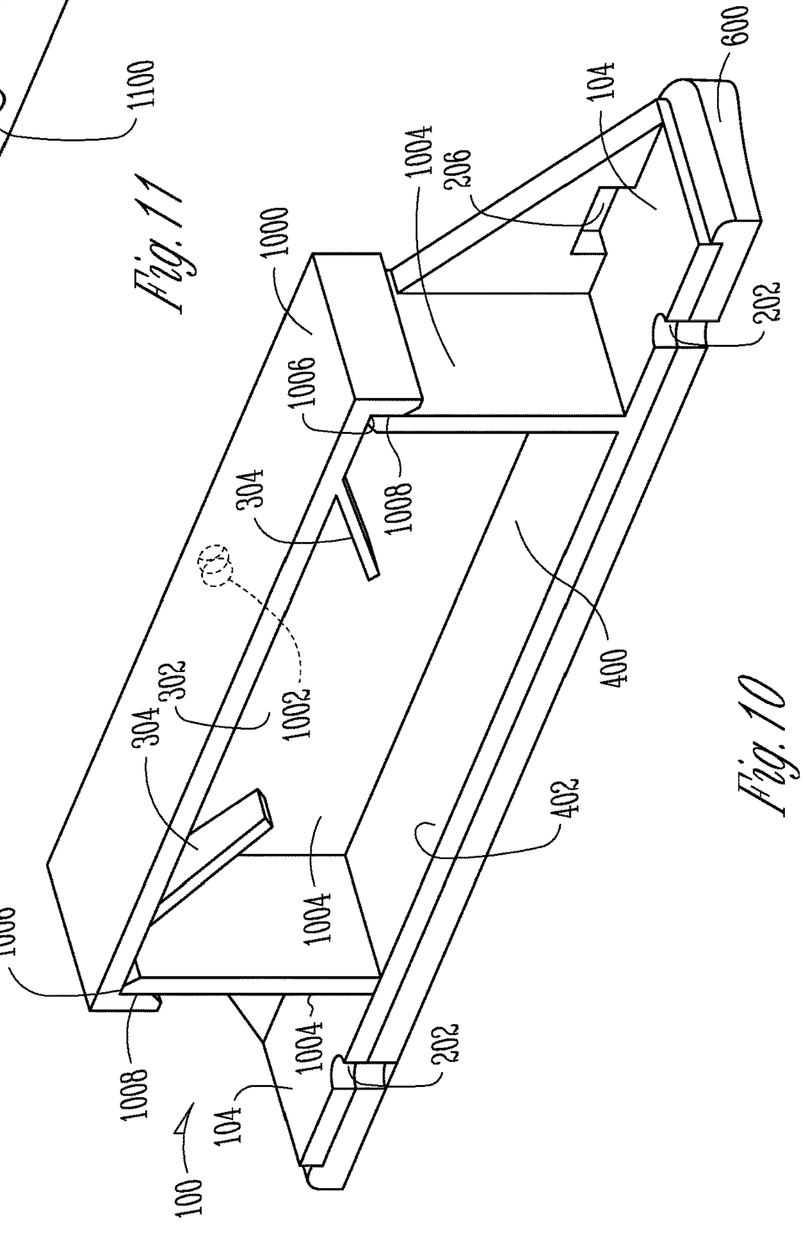

In addition to enclosing the cavity 302 with the lid 204, alternatively, the mount 100 can include a lid 1000 that encloses the cavity 302, as shown with reference to FIGS. 10 and 11. Instead of using tabs to secure the lid 1000 to the housing 200, the lid 1000 can have fastener holes 1100 that align with fastener holes 1002 of a side wall 1004 of the housing 200. The fastener holes 1002 and 1100 can be configured to accept any type of fasteners, such as rivets, threaded fasteners, or any other type of fastening means capable of securing the lid 1000 to the side wall 1004. The lid 1000 can also include the sensor support mechanisms 304, which can bias the sensor 400 against the bottom surface 402, as discussed above.

Figure 12:
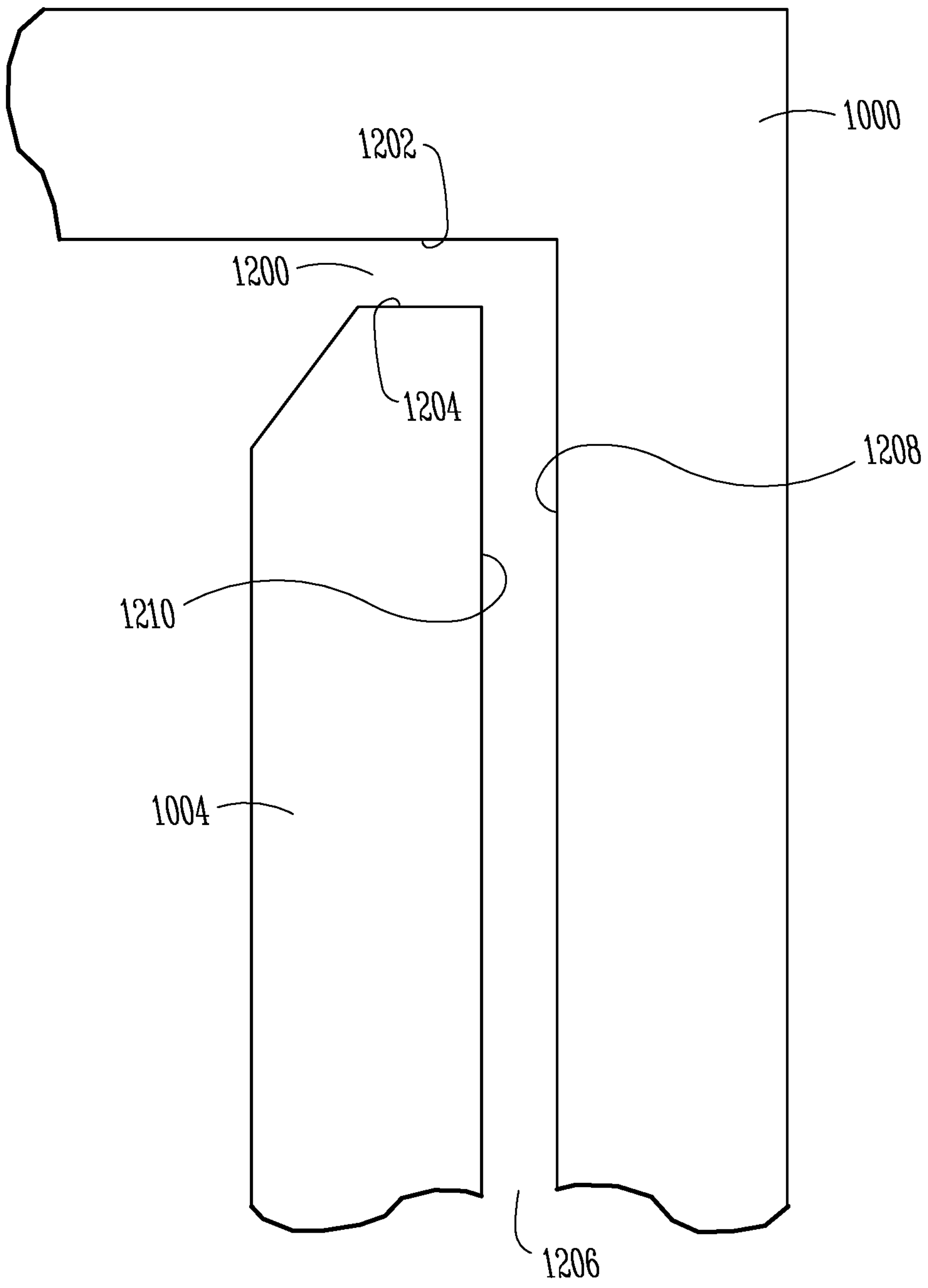
FIG. 12 illustrates gaps defined between a side wall of the housing of FIGS. 10 and 11 and the lid shown in FIGS. 10 and 11.

When the lid 1000 is secured with the housing 200 in a closed position, the lid 1000 can rest on the side walls 1004 and form seams 1006 and 1008. At the seam 1006, as shown with reference to FIG. 12, a gap 1200 can be formed between a bottom surface 1202 of the lid 1000 and the top surface 1204 of the side wall 1004. At the seam 1008, a gap 1206 can be formed between an inner surface 1208 of the lid 1000 and an outer surface 1210 of the side wall 1004. Here, data from the sensor 400 can be transmitted through the mount 100 via the gaps 1200 and 1206, as described above with reference to FIG. 5 and the seam 310.

Figure 13:
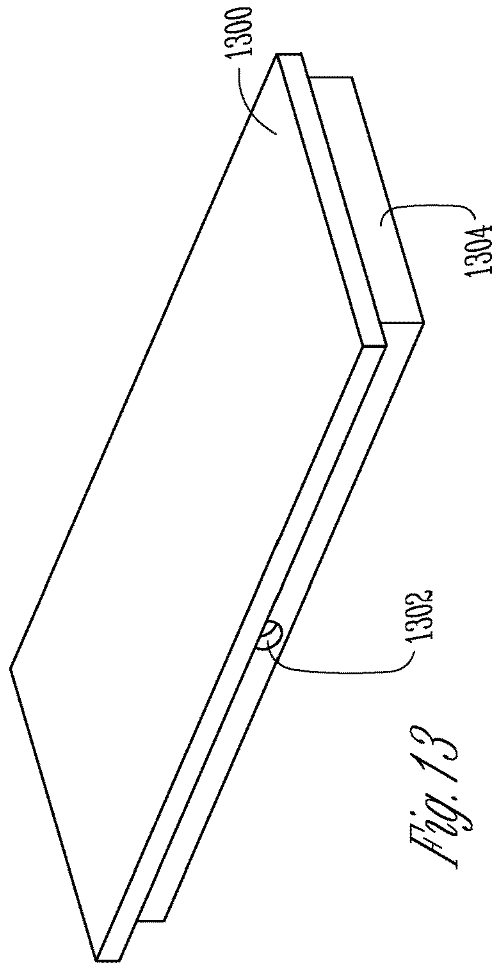
FIGS. 13 and 14 show the coupling of a lid to a housing that can be coupled with the casing of FIG. 1 in alternative examples.
Figure 14:
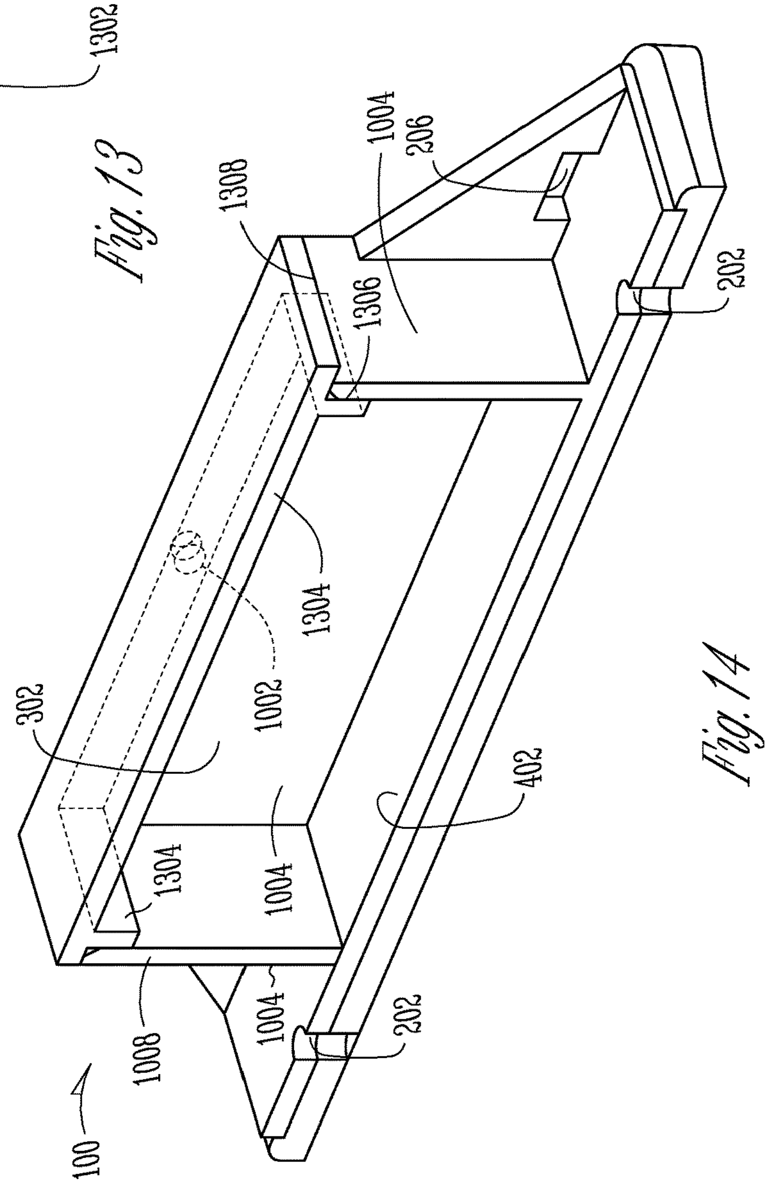

Furthermore, the mount 100 can include a lid 1300 that encloses the cavity 302, as shown with reference to FIGS. 13 and 14. Similar to the lid 1000, the lid 1300 can include fastener holes 1302 that align with the fastener holes 1002 of the side wall 1004. The fastener holes 1302 can be configured to accept any type of fasteners, such as rivets, threaded fasteners, or any other type of fastening means capable of securing the lid 1300 to the side wall 1004. The lid 1300 can also include a lip 1304 that can function as a biasing means against the sensor 400 when the lid 1300 is secured to the housing 200 and the sensor 400 is disposed in the cavity 302. In particular, similar to the sensor support mechanisms 304, the lip 1304 can bias the sensor 400 against the bottom surface 402, as discussed above with reference to the sensor support mechanisms 304.

Figure 15:
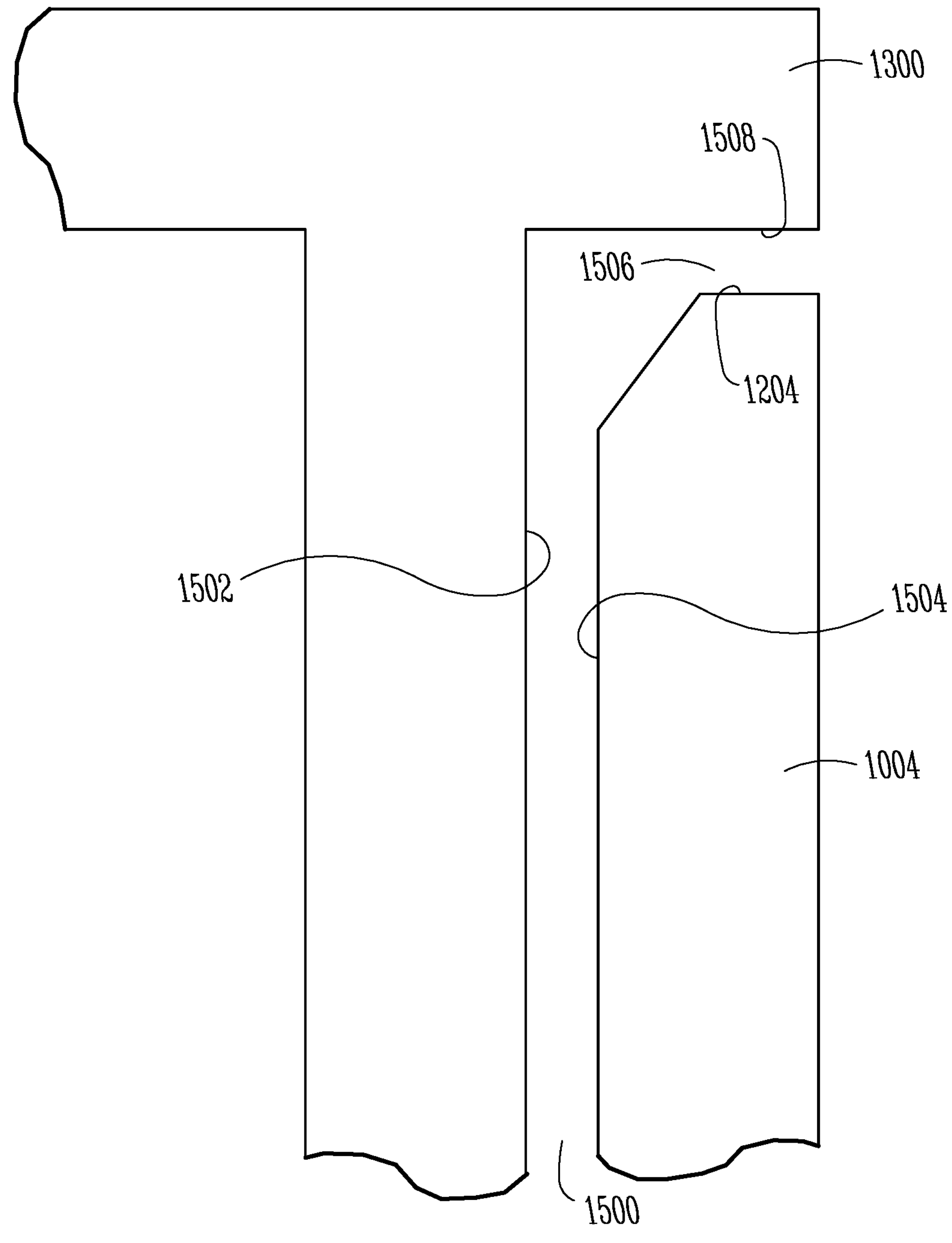
FIG. 15 illustrates gaps defined between a side wall of the housing of FIGS. 13 and 14 and the lid shown in FIGS. 13 and 14.

When the lid 1300 is secured with the housing 200, seams 1306 and 1308 can be formed between the lid 1300 and the side wall 1004. The seam 1306 can define a gap 1500 between a side surface 1502 of the lid 1300 and an inner surface 1504 of the side wall 1004, as shown with reference to FIG. 15. The seam 1308 can define a gap 1506 between a bottom surface 1508 of the lid 1300 and the top surface 1204 of the side wall 1004. Data from the sensor 400 can be transmitted through the mount 100 via the gaps 1500 and 1506, as described above with reference to FIG. 5 and the seam 310.

Figure 16:
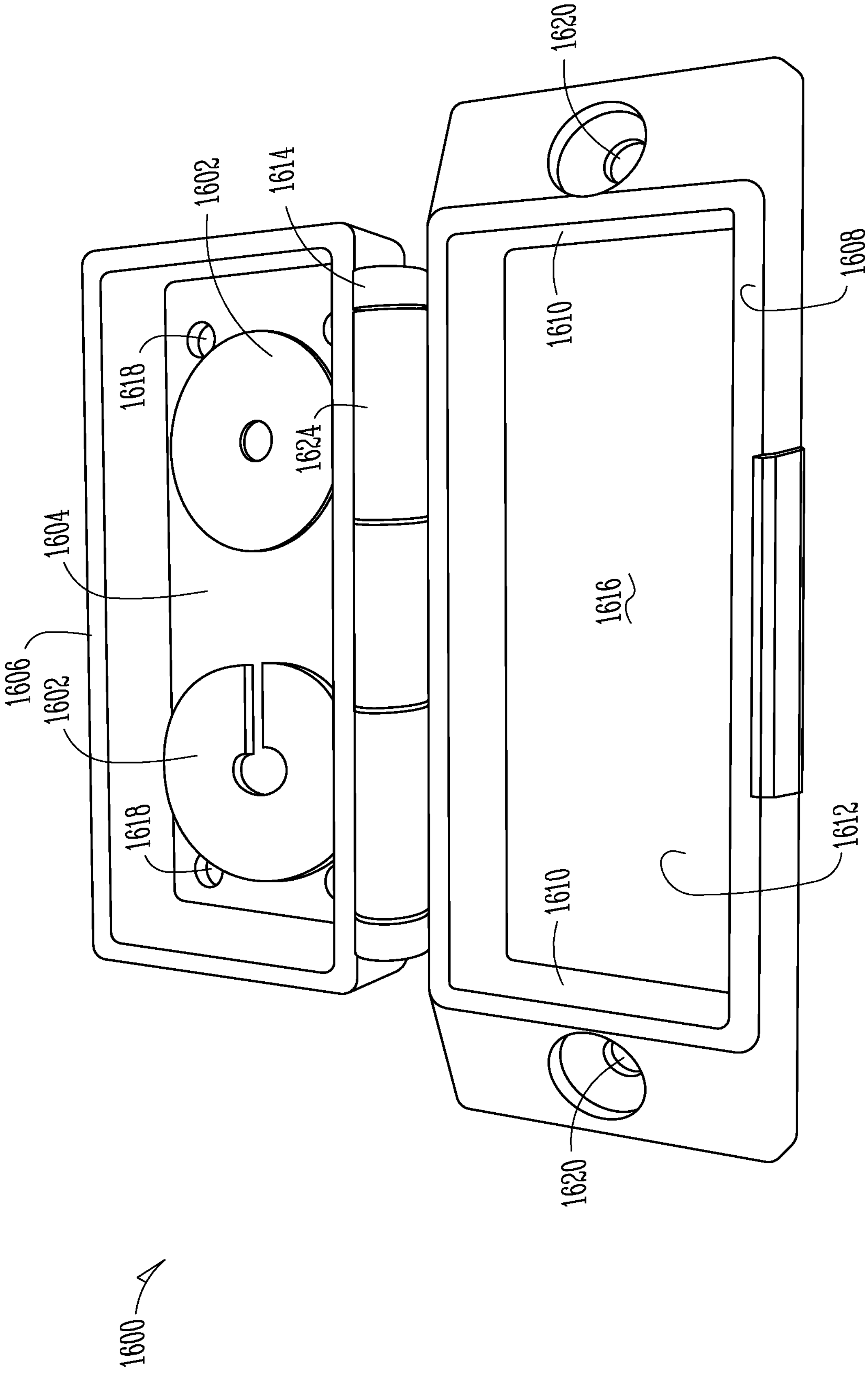
FIGS. 16-18 show a housing that can be coupled with the casing of FIG. 1 in further examples.
Figure 17:
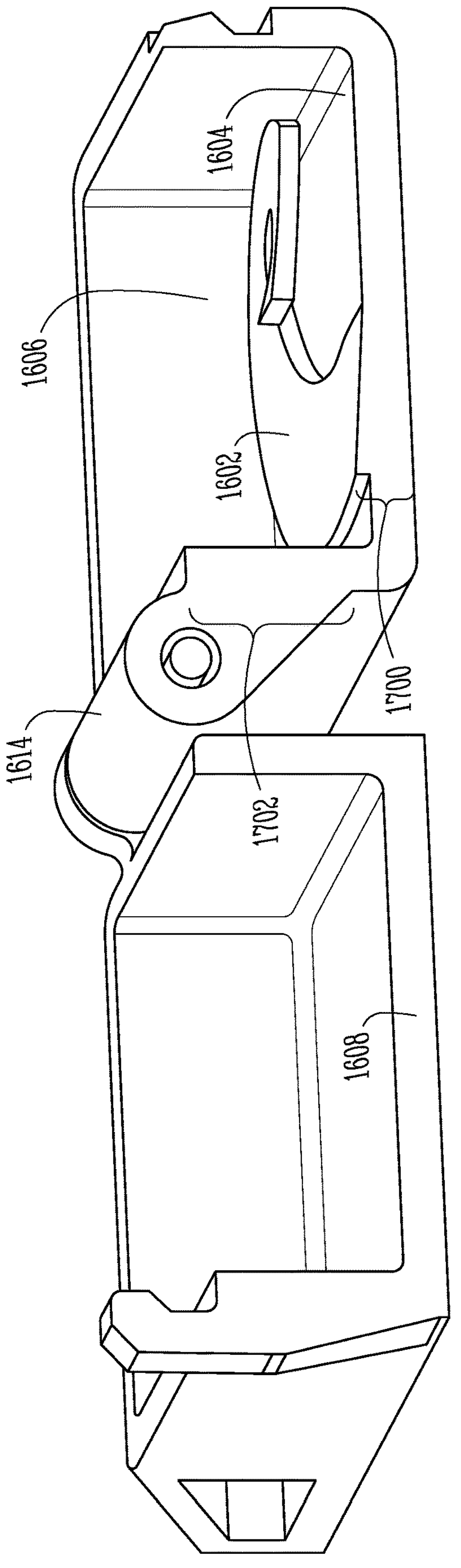
Figure 18:
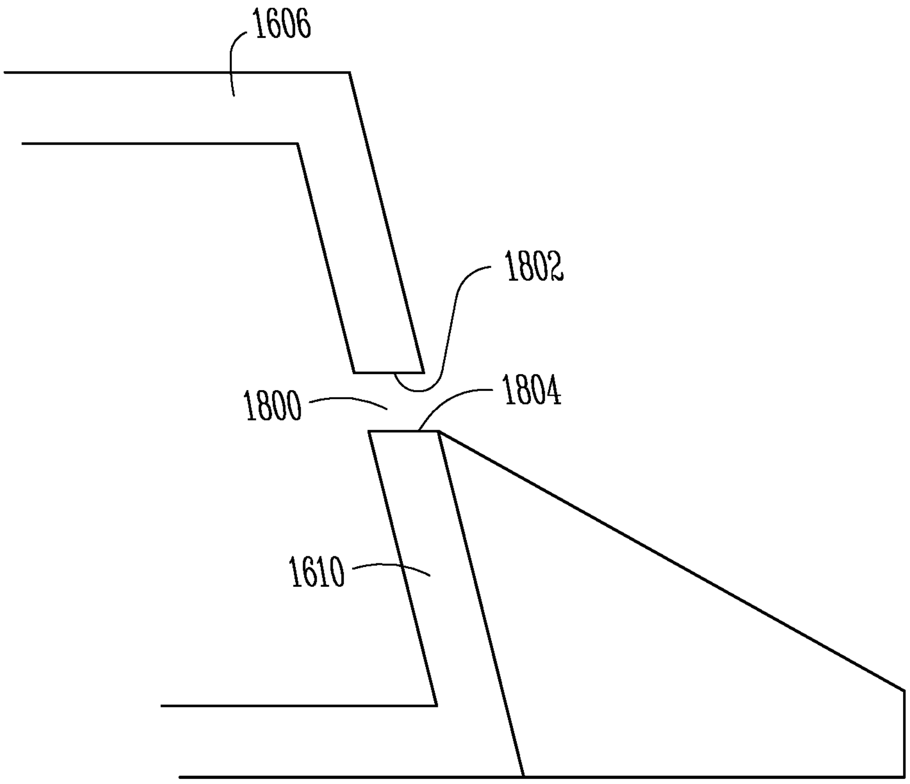

The biasing means in the mount can also include a compression spring extending from the lid and into the cavity when the lid is in a closed position relative to the housing, as shown with reference to FIGS. 16-18. More specifically, a mount 1600 can include a biasing means 1602 extending from a bottom surface 1604 of a lid 1606. The biasing means 1602 can have the shape and functionality of a compression spring. As such, when the lid 1606 is in a closed position relative to a housing 1608 having side walls 1610 extending from a bottom surface 1612 of the housing 1608 of the mount 1600, the biasing means 1602 can bias a sensor 400 against the housing bottom surface 1612, in order to facilitate direct readings of vibration and/or shock imparted to the casing 102 and assets, as described above. Moreover, the biasing means 1602 can have the same configuration and properties as the sensor support mechanism 304 previously discussed.

The mount 1600 can include a coupling mechanism 1614, which can facilitate coupling of the lid 1606 with the housing 1608. The coupling mechanism 1614 can be a hinge, which couples the lid 1606 to the housing 1608. However, examples are not limited to a hinge. The coupling mechanism 1614 can be any type of mechanism that facilitates coupling the lid 1606 with the housing 1608 while at the same time, as will be discussed further on, allows for the manufacturing of the mount 1600 in a single process. Furthermore, the coupling mechanism 1614 can be a flexure-based compliant mechanism, flexure-based compliant connection, or a strap-based segmented or non-segmented connection method. In addition, the coupling mechanism 1614 can be a rotatable axle-based connection by way of a post and barrel connection joint.

The mount 1600 can be formed during a single manufacturing process where the biasing means 1602, the lid 1606, the housing 1608, the housing side walls 1610, the housing bottom surface 1612, and the coupling mechanism 1614 are formed using an additive manufacturing process, such as three-dimensional printing, or the like. In addition, the mount 1600 can be formed from a single material, such as any type of basic polymer, composite polymer, or metal, such as a carbon or glass filled nylon, carbon or glass filled PET, ABS, PET-G, PEI, PEEK/PEKK, Aluminum Alloy, or any other type of material that lends itself to a single manufacturing process. Additionally, the lid 1606 can also include passageways 1618 that can function to vent a cavity 1616 when the lid 1606 is secured to the housing 1608 in a closed position in order to maintain atmospheric equilibrium. In an alternative embodiment the mount includes only the aforementioned base which is affixed to the asset. The base can have a means of attachment to the sensor such as straps, spring arms with barbs, two-sided tape with less adhesion than the base to asset adhesion, hook-n-loop, etc.

The biasing means 1602, the lid 1606, and the coupling mechanism 1614 can form a unitary structure. In particular, since each of the biasing means 1602, the lid 1606, and the coupling mechanism 1614 can be formed with an additive manufacturing process, the biasing means 1602 can be formed with the lid bottom surface 1604 as shown at 1700 in FIG. 17. Similarly, the coupling mechanism 1614 can be formed with the lid 1606 as shown at 1702 in FIG. 17.

Similar to the mount 100, when in a closed position, the mount 1600 can include seams that allow for the transmission of data of a sensor, such as the sensor 400, from within the cavity 1616 formed by the housing 1608. As shown with reference to FIG. 18, a gap 1800 can be defined at the seam with the mount 1600 is in a closed position. In particular, the gap 1800 can be defined between a bottom surface 1802 of the lid 1606 and a top surface 1804 of the housing side wall 1610. Data from the sensor 400 can be transmitted through the mount 1600 via the gap 1800 and the passageways 1618, as described above with reference to FIG. 5 and the seam 310.

The mount 1600 can include fastener holes 1620, which, similar to the fastener holes 202, can be used to attach the mount 1600 to a casing, such as the casing 102. Moreover, the fastener holes 1620 can be used to attach the mount 1600 directly to an asset. In addition, the mount 1600 can couple with the housing nesting tray 600 when the mount 1600 is to be used with a casing having a curved surface, as discussed above.

In further examples, the sidewalls of the mount can be configured to hold the sensor within the housing. The sidewalls could be tapered such that an interference fit is provided between the sidewalls and the sensor. Here, the side walls can taper towards the base plate in order to provide the interference fit. Furthermore, the side walls could include barbs that extend from the side walls. The bards can be configured to compress against the sensor when the sensor is disposed within the housing. In addition, the sidewalls could be spaced such that the sensor is held in place via a frictional fit. In these examples, the support mechanism can include the barbs.

ADDITIONAL EXAMPLES

Example 1 is a mount for housing a sensor, the mount comprising: a housing having a base plate and a plurality of side walls extending from the base plate to form a cavity, the base plate being configured to couple the mount with a surface of a casing; a lid coupled with a first side wall of the plurality of side walls, the lid having at least one through hole, wherein a gap is formed between a portion of the lid and a second side wall of the plurality of side walls when the lid is coupled with the first side wall, the gap and the at least one through hole being configured to permit transmission of data from the sensor and through the mount; a hinge coupled with the lid and the first side wall of the plurality of side walls; and a compression spring extending from a bottom surface of the lid toward the base plate, the compression spring configured to bias the sensor against the base plate in a longitudinal direction and a lateral direction, wherein the lid and the compression spring form a unitary structure, wherein when the sensor is disposed within the cavity, the sensor being configured to transmit the data in the form of magnetic waves or RF signals through the gap and the at least one through hole to a remote location when the sensor tracks a condition associated with the casing or an asset disposed within the casing.

In Example 2, the subject matter of Example 1 includes, wherein the lid rests on the second side wall of the plurality of side walls and forms a seam in a closed position and the gap is formed at the seam.

In Example 3, the subject matter of Examples 1-2 includes, a nesting tray having a first a surface and a second surface that opposes the first surface, the first surface configured to engage with the base plate and the second surface having a first radius configured to engage with the surface, the surface having a second radius different from the first surface.

Example 4 is a system to implement of any of Examples 1-3.

Example 5 is a method to implement of any of Examples 1-3.

Example 6 is a mount for housing a sensor, the mount comprising: a housing having a base plate and a plurality of side walls extending from the base plate to form a cavity configured to hold the sensor, the base plate and the plurality of side walls being formed from iron, the base plate being configured to couple the mount with a surface; a lid coupled with a first side wall of the plurality of side walls and resting on a second side wall of the plurality of side walls, the lid including: at least one through hole, wherein a gap is formed between a portion of the lid and the second side wall of the plurality of side walls when the lid is coupled with the second side wall, the gap and the at least one through hole being configured to permit transmission of data from the sensor and through the mount; and a tab where the second side wall includes, a recess configured to hold the tab; and a support mechanism extending from a bottom surface of the lid toward the base plate, the support mechanism configured to bias the sensor against the base plate in a longitudinal direction and a lateral direction.

In Example 7, the subject matter of Example 6 includes, a nesting tray having a first a surface and a second surface that opposes the first surface, the first surface configured to engage with the base plate and the second surface having a first radius configured to engage with the surface, the surface having a second radius different from the first surface, wherein when the sensor is disposed within the cavity, the sensor being configured to transmit the data in the form of wired signals through wires that traverse from inside the mount to outside the mount thru at least one through hole to a remote location when the sensor tracks a condition associated with a casing to which the housing is attached or an asset disposed within the casing.

In Example 8, the subject matter of Examples 6-7 includes, wherein a second gap is formed between the tab and the side wall recess when the tab is disposed within the side wall recess, the second gap being configured to permit the transmission of the data from the sensor and through the mount.

Example 9 is a system to implement of any of Examples 6-8.

Example 10 is a method to implement of any of Examples 6-8.

Example 11 is a mount for housing a sensor, the mount comprising: a housing having a base plate and a plurality of side walls extending from the base plate to form a cavity configured to hold the sensor, the base plate being configured to couple the mount with a surface; a lid coupled with a first side wall of the plurality of side walls, the lid having at least one through hole, wherein a gap is formed between a portion of the lid and a second side wall of the plurality of side walls when the lid is coupled with the first side wall, the gap and the at least one through hole being configured to permit transmission of data from the sensor and through the mount; and a support mechanism disposed within the housing, the support mechanism configured to bias the sensor against the base plate in a longitudinal direction and a lateral direction.

In Example 12, the subject matter of Example 11 includes, a nesting tray having a first surface and a second surface that opposes the first surface, the first surface configured to engage with the base plate and the second surface having a first radius configured to engage with the surface, the surface having a second radius different from the first surface.

In Example 13, the subject matter of Examples 11-12 includes, wherein the base plate includes a through hole at a portion of the base plate that extends beyond the second side wall of the plurality of side walls, the base plate through hole configured to receive a fastener for fastening the base plate to the surface.

In Example 14, the subject matter of Examples 11-13 includes, a hinge coupled with the first side wall of the plurality of side walls, wherein the lid, the hinge, and the support mechanism form a unitary structure.

In Example 15, the subject matter of Examples 11-14 includes, wherein the support mechanism extends from a bottom surface of the lid toward the base plate and is a compression spring that extends from the bottom surface of the lid.

In Example 16, the subject matter of Examples 11-15 includes, wherein the lid rests on the plurality of side walls and forms a seam in a closed position and the gap is formed at the seam.

In Example 17, the subject matter of Examples 11-16 includes, wherein the lid rests on the plurality of side walls and forms a seam in a closed position and the gap is formed at the seam.

In Example 18, the subject matter of Examples 11-17 includes, wherein the lid includes a tab and the second side wall of the plurality of side walls includes a recess configured to hold the tab.

In Example 19, the subject matter of Examples 11-18 includes, wherein a second gap is formed between the tab and the side wall recess when the tab is disposed within the side wall recess, the second gap being configured to permit the transmission of the data from the sensor and through the mount.

In Example 20, the subject matter of Examples 11-19 includes, wherein the support mechanism is an arm extending from a bottom surface of the lid towards the base plate.

In Example 21, the subject matter of Examples 11-20 includes, wherein the lid rests on the second side wall of the plurality of side walls and the support mechanism is a lip that extends from a bottom surface of the lid.

In Example 22, the subject matter of Examples 11-21 includes, wherein the base plate and the plurality of side walls are formed from metal.

In Example 23, the subject matter of Examples 11-22 includes, wherein the side walls taper inward at the base plate and form the support mechanism.

In Example 24, the subject matter of Examples 11-23 includes, wherein the plurality of sidewalls includes barbs extending from the side walls, the barbs being configured to compress against the sensor when the sensor is disposed within the housing Example 25 is a system to implement of any of Examples 11-24.

Example 26 is a method to implement of any of Examples 11-24.

Although teachings have been described with reference to specific example teachings, it will be evident that various modifications and changes may be made to these teachings without departing from the broader spirit and scope of the teachings. Accordingly, the specification and drawings are to be regarded in an illustrative rather than a restrictive sense. The accompanying drawings that form a part hereof, show by way of illustration, and not of limitation, specific teachings in which the subject matter may be practiced. The teachings illustrated are described in sufficient detail to enable those skilled in the art to practice the teachings disclosed herein. Other teachings may be utilized and derived therefrom, such that structural and logical substitutions and changes may be made without departing from the scope of this disclosure. This Detailed Description, therefore, is not to be taken in a limiting sense, and the scope of various teachings is defined only by the appended claims, along with the full range of equivalents to which such claims are entitled.

What is claimed is:

1. A mount for housing a sensor, the mount comprising:

a housing having a base plate and a plurality of side walls extending from the base plate to form a cavity, the base plate being configured to couple the mount with a surface of a casing;

a lid coupled with a first side wall of the plurality of side walls, the lid having at least one through hole, wherein a gap is formed between a portion of the lid and a second side wall of the plurality of side walls when the lid is coupled with the first side wall, the gap and the at least one through hole being configured to permit transmission of data from the sensor and through the mount;

a hinge coupled with the lid and the first side wall of the plurality of side walls; and a compression spring extending from a bottom surface of the lid toward the base plate, the compression spring configured to bias the sensor against the base plate in a longitudinal direction and a lateral direction, wherein the lid and the compression spring form a unitary structure, wherein when the sensor is disposed within the cavity, the sensor being configured to transmit the data, the transmitted data being one of magnetic waves or RF signals through the gap and the at least one through hole to a remote location when the sensor tracks a condition associated with the casing or an asset disposed within the casing.

2. The mount of claim 1, wherein the lid rests on the second side wall of the plurality of side walls and forms a seam in a closed position and the gap is formed at the seam.

3. The mount of claim 1, further comprising a nesting tray having a first a surface and a second surface that opposes the first surface, the first surface configured to engage with the base plate and the second surface having a first radius configured to engage with the casing surface, the casing surface having a second radius different from the first surface.

4. A mount for housing a sensor, the mount comprising:

a housing having a base plate and a plurality of side walls extending from the base plate to form a cavity configured to hold the sensor, the base plate and the plurality of side walls being formed from iron, the base plate being configured to couple the mount with a surface;

a lid coupled with a first side wall of the plurality of side walls and resting on a second side wall of the plurality of side walls, the lid including:

at least one through hole, wherein a gap is formed between a portion of the lid and the second side wall of the plurality of side walls when the lid is coupled with the second side wall, the gap and the at least one through hole being configured to permit transmission of data from the sensor and through the mount; and a tab where the second side wall includes a recess configured to hold the tab; and a support mechanism extending from a bottom surface of the lid toward the base plate, the support mechanism configured to bias the sensor against the base plate in a longitudinal direction and a lateral direction.

5. The mount of claim 4, wherein when the sensor is disposed within the cavity, the sensor being configured to transmit the data where the transmitted data are in the form of wired signals transmitted through wires that traverse from inside the mount to outside the mount thru at least one through hole to a remote location when the sensor tracks a condition associated with a casing to which the housing is attached or an asset disposed within the casing, the casing having a surface and the mount further comprising a nesting tray having a first a surface and a second surface that opposes the first surface, the first surface configured to engage with the base plate and the second surface having a first radius configured to engage with the casing surface, the casing surface having a second radius different from the first surface.

6. The mount of claim 4, wherein a second gap is formed between the tab and the side wall recess when the tab is disposed within the side wall recess, the second gap being configured to permit the transmission of the data from the sensor and through the mount.

7. A mount for housing a sensor, the mount comprising:

a housing having a base plate and a plurality of side walls extending from the base plate to form a cavity configured to hold the sensor, the base plate being configured to couple the mount with a surface;

a lid coupled with a first side wall of the plurality of side walls, the lid having at least one through hole, wherein a gap is formed between a portion of the lid and a second side wall of the plurality of side walls when the lid is coupled with the first side wall, the gap and the at least one through hole being configured to permit transmission of data from the sensor and through the mount; and a support mechanism disposed within the housing, the support mechanism configured to bias the sensor against the base plate in a longitudinal direction and a lateral direction.

8. The mount of claim 7, wherein the base plate is configured to couple the mount with a surface of a casing, the mount further comprising a nesting tray having a first surface and a second surface that opposes the first surface, the first surface configured to engage with the base plate and the second surface having a first radius configured to engage with the casing surface, the casing surface having a second radius different from the first surface.

9. The mount of claim 7, wherein the base plate includes a through hole at a portion of the base plate that extends beyond the second side wall of the plurality of side walls, the base plate through hole configured to receive a fastener for fastening the base plate to the surface.

10. The mount of claim 7, further comprising a hinge coupled with the first side wall of the plurality of side walls, wherein the lid, the hinge, and the support mechanism form a unitary structure.

11. The mount of claim 7, wherein the support mechanism extends from a bottom surface of the lid toward the base plate and is a compression spring that extends from the bottom surface of the lid.

12. The mount of claim 10, wherein the lid rests on the plurality of side walls and forms a seam in a closed position and the gap is formed at the seam.

13. The mount of claim 7, wherein the lid rests on the plurality of side walls and forms a seam in a closed position and the gap is formed at the seam.

14. The mount of claim 7, wherein the lid includes a tab and the second side wall of the plurality of side walls includes a recess configured to hold the tab.

15. The mount of claim 14, wherein a second gap is formed between the tab and the side wall recess when the tab is disposed within the side wall recess, the second gap being configured to permit the transmission of the data from the sensor and through the mount.

16. The mount of claim 14, wherein the support mechanism is an arm extending from a bottom surface of the lid towards the base plate.

17. The mount of claim 7, wherein the lid rests on the second side wall of the plurality of side walls and the support mechanism is a lip that extends from a bottom surface of the lid.

18. The mount of claim 7, wherein the base plate and the plurality of side walls are formed from metal.

19. The mount of claim 7, wherein the side walls taper inward at the base plate and form the support mechanism.

20. The mount of claim 7, wherein the plurality of side walls includes barbs extending from the side walls, the barbs being configured to compress against the sensor when the sensor is disposed within the housing.

* * * * *